(12) United States Patent
Khalid et al.

(10) Patent No.: US 11,799,054 B1
(45) Date of Patent: Oct. 24, 2023

(54) MONOCHROMATIC EMITTERS ON COALESCED SELECTIVE AREA GROWTH NANOCOLUMNS

(71) Applicant: 4233999 Canada Inc., Westmount (CA)

(72) Inventors: Najeeb Ashraf Khalid, Westmount (CA); Huy Binh Le, Brossard (CA); Hong Nhung Tran, Brossard (CA)

( * ) Notice: Subject to any disclaimer, the term of this patent is extended or adjusted under 35 U.S.C. 154(b) by 0 days.

(21) Appl. No.: 18/170,638

(22) Filed: Feb. 17, 2023

Related U.S. Application Data

(60) Provisional application No. 63/483,818, filed on Feb. 8, 2023.

(51) Int. Cl.

| | |
|---|---|
| *H01L 33/00* | (2010.01) |
| *H01L 33/08* | (2010.01) |
| *H01L 33/24* | (2010.01) |
| *H01L 33/32* | (2010.01) |
| *C30B 23/04* | (2006.01) |
| *C30B 23/02* | (2006.01) |
| *C30B 29/40* | (2006.01) |
| *C30B 29/66* | (2006.01) |
| *C30B 29/60* | (2006.01) |
| *H01L 33/40* | (2010.01) |
| *H01L 33/44* | (2010.01) |
| *H01L 33/58* | (2010.01) |
| *H01L 33/06* | (2010.01) |

(52) U.S. Cl.
CPC .......... *H01L 33/007* (2013.01); *C30B 23/025* (2013.01); *C30B 23/04* (2013.01); *C30B 29/403* (2013.01); *C30B 29/406* (2013.01); *C30B 29/605* (2013.01); *C30B 29/66* (2013.01); *H01L 33/06* (2013.01); *H01L 33/08* (2013.01); *H01L 33/24* (2013.01); *H01L 33/32* (2013.01); *H01L 33/405* (2013.01); *H01L 33/44* (2013.01); *H01L 33/58* (2013.01); *H01L 2933/0016* (2013.01); *H01L 2933/0025* (2013.01); *H01L 2933/0058* (2013.01)

(58) Field of Classification Search
CPC ....... H01L 33/007; H01L 33/06; H01L 33/08; H01L 33/24; H01L 33/32; H01L 33/405; H01L 33/44; H01L 33/58; H01L 2933/0016; H01L 2933/0025; H01L 2933/0058; C30B 23/025; C30B 23/04; C30B 29/403; C30B 29/406; C30B 29/605; C30B 29/66
See application file for complete search history.

(56) References Cited

U.S. PATENT DOCUMENTS

| | | |
|---|---|---|
| 10,177,195 B2 | 1/2019 | Ahmed et al. |
| 10,263,149 B2 | 4/2019 | Samuelson et al. |
| 10,651,341 B2 | 5/2020 | Amstatt et al. |
| 10,734,442 B2 | 8/2020 | Chio et al. |

(Continued)

OTHER PUBLICATIONS

Corresponding U.S. Appl. No. 16/675,445 Office Action dated Mar. 27, 2020.

(Continued)

*Primary Examiner* — Samuel A Gebremariam (57) ABSTRACT

A light emitting structure has quantum wells grown on a coalesced substrate stemming from nanocolumns. The crystal structure is very low in defects and efficiency of light production is good. By growing the nanocolumns at a lower temperature, the quantum well structure is better matched to the coalesced substrate and efficiency is improved.

19 Claims, 6 Drawing Sheets

(56) References Cited

U.S. PATENT DOCUMENTS

| | | |
|---|---|---|
| 11,094,846 B1 | 8/2021 | Khalid et al. |
| 2003/0168964 A1 | 9/2003 | Chen |
| 2006/0208273 A1 | 9/2006 | Kang |
| 2009/0243043 A1 | 10/2009 | Wang |
| 2009/0267049 A1 | 10/2009 | Cho et al. |
| 2010/0051986 A1 | 3/2010 | Min et al. |
| 2010/0207096 A1 | 8/2010 | Tang et al. |
| 2011/0012168 A1 | 1/2011 | Armitage |
| 2011/0169025 A1 | 7/2011 | Kishino et al. |
| 2011/0253982 A1 | 10/2011 | Wang et al. |
| 2012/0025232 A1 | 2/2012 | Gwo et al. |
| 2012/0261686 A1 | 10/2012 | Lu |
| 2013/0112944 A1 | 5/2013 | Cha et al. |
| 2014/0166974 A1 | 6/2014 | Yoo et al. |
| 2016/0155940 A1 | 6/2016 | Chen et al. |
| 2017/0279017 A1 | 9/2017 | Konsek et al. |
| 2017/0352601 A1 | 12/2017 | Hugon |
| 2018/0374988 A1 | 12/2018 | Mi et al. |
| 2019/0131345 A1 | 5/2019 | Ahmed et al. |
| 2019/0333963 A1 | 10/2019 | Chio et al. |
| 2019/0363069 A1 | 11/2019 | Ahmed et al. |
| 2020/0091388 A1 | 3/2020 | Chaji et al. |
| 2020/0119233 A1 | 4/2020 | Dupont |
| 2020/0152113 A1 | 5/2020 | Hugon et al. |
| 2020/0161285 A1 | 5/2020 | Tan et al. |
| 2020/0161520 A1 | 5/2020 | Hugon et al. |
| 2020/0259055 A1 | 8/2020 | Iguchi et al. |
| 2020/0300422 A1 | 9/2020 | Tan et al. |

OTHER PUBLICATIONS

Sekiguchi et al., Emission color control from blue to red with nanocolumn diameter of InGaN/GaN nanocolumn arrays grown on same substrate, Applied Physics Letters, 96, 231104 (2010).

International application No. PCT/CA2021/051123 International Search Report dated Dec. 8, 2021.

International application No. PCT/CA2021/051123 Search Strategy dated Dec. 8, 2021.

International application No. PCT/CA2021/051123 Written Opinion of the International Searching Authority dated Dec. 8, 2021.

International application No. PCT/CA2021/051123 International Supplemental Search Report dated Dec. 6, 2022.

Corresponding U.S. Appl. No. 17/578, 123 Office Action dated May 27, 2022.

Huy Binh Le, III-Nitride Nanowire Heterostructures: p-Type Conduction and High Efficiency Infrared and Ultraviolet Light Sources. Thesis, submitted Oct. 2016. Chapter 5: Controlled Coalescence of AlGaN Nanowire Arrays: An Architecture for Nearly Dislocation-Free Planar Ultraviolet Photonic Device Applications. McGill University (Canada) ProQuest Dissertations Publishing, 2017. pp. 74-95.

Providing a growth substrate with a mask defining apertures for the base of the nanocolumns Heating the growth base to a first temperature of about 785°C, the first temperature must be suitable for reducing defects in the multiple quantum wells formed on the coalesced substrate of negatively-doped GaN Controlling a flux of nitrogen with respect to gallium in order to reduce a concentration of gallium relative to gallium-nitride present at the mask, so as to grow the negatively-doped GaN nanocolumns using molecular beam epitaxy in the apertures until the coalesced substrate is formed, while preventing material from growing on the mask between the apertures Heating the growth base and the coalesced substrate to a second temperature of about 650°C or less, the second temperature must be suitable for forming the multiple quantum wells with indium having an enhanced compatibility with the layer pf positively-doped GaN Controlling a flux of the indium to form multiple quantum wells on the coalesced substrate using molecular beam epitaxy Heating the growth base and the coalesced substrate to a third temperature of about 760 to about 785°C Forming a layer of the positively-doped GaN on the multiple quantum wells using molecular beam epitaxy Coating the coalesced substrate, multiple quantum wells, and the layer of positively-doped GaN with an insulation layer Following a dry etching process of the top of the light emitting device to reveal the layer of positively-doped GaN and subsequently depositing a metal stack Ni, followed by an annealing process for achieving ohmic contacts at the positively-doped GaN Polishing a back side of the sapphire plane and adding a micro lens to the back side

MONOCHROMATIC EMITTERS ON COALESCED SELECTIVE AREA GROWTH NANOCOLUMNS

CROSS-REFERENCE

This application claims priority from U.S. provisional patent application 63/483,818 filed Feb. 8, 2023, which is hereby incorporated by reference.

FIELD OF THE TECHNOLOGY

The present technology relates to semiconductor light sources, and in particular to high efficiency selective area growth nanocolumn monochromatic photon sources.

BACKGROUND

All commercial semiconductor emitters today are made with the metalorganic chemical vapour deposition (hereinafter: MOCVD) process for the epitaxial growth. Depending on the desirable emission wavelengths, the base templates, which include GaN, GaAs, or GaP, are chosen to achieve the highest device performance. Quantum wells (hereinafter: QWs) are constructed by adding indium (hereinafter: In) and aluminum (hereinafter: Al) for tuning the wavelength.

The current methods used to fabricate emitters are based on thin film technologies using different materials for different wavelengths. However, high level of crystal structural defects due to lattice mismatch between template and grown structure is partly responsible for the low external quantum efficiency (hereinafter: EQE) of thin film devices, especially at shorter wavelength and smaller device sizes. Bulk materials, which are used as growth templates with low defect density, are available on the market but high cost.

Nanocolumn growth for numerous applications are reported in the scientific literature. Growing nanocolumns for emitting emission in the UVB (340 nm) range has been seen in the Ph.D. dissertation titled "III-Nitride Nanowire Heterostructures: p-Type Conduction and High Efficiency Infrared and Ultraviolet Light Sources" by Huy Binh Le, October 2016, Department of Electrical and Computer Engineering, McGill University, Montreal, Canada. Grown Nanocolumns for visible emission can be found in the Ph.D. dissertation titled "Selective Area Epitaxy of GaN-based Nanowire Heterostructures for Application in Photonic and Electronic Devices" by Renjie Wang, July 2018, Department of Electrical and Computer Engineering, McGill University, Montreal, Canada. No complete devices have been shown of any practical efficiency. Mention of both spontaneous growth and selective area growth are found and although instructive, do not show efficient devices.

Selective area growth (hereinafter: SAG) GaN nanocolumns (hereinafter: NCs) is an emerging platform for nanophotonic devices. Such nanocolumns, grown using molecular beam epitaxy (hereinafter: MBE) are very low in crystal lattice defects, that are common in MOCVD grown thin film devices. The lack of these defects promises greater efficiency in converting electrical power to light.

However, to maintain the crystal quality of GaN NCs and to achieve selectivity, the SAG process is carried out at higher substrate temperatures (up to 900 degrees C.) compared to the self-assembled process, wherein the growth temperature is about 750 degrees C. Growing at high temperature is to provide nucleation and growth within the nanoholes while trying to avoid its deposition and growth on the mask.

SUMMARY

It is thus an object of the present technology to ameliorate at least some of the inconveniences present in the prior art.

While it is known in the art to form a coalesced GaN nanocolumn substrate for making a heterojunction light emitting device (see the Ph.D. dissertation titled "III-Nitride Nanowire Heterostructures: p-Type Conduction and High Efficiency Infrared and Ultraviolet Light Sources" by Huy Binh Le, October 2016, Department of Electrical and Computer Engineering, McGill University, Montreal, Canada), it is not known in the art to fabricate multiple quantum wells on a coalesced GaN nanocolumn substrate.

A light emitting structure has quantum wells grown on a coalesced substrate stemming from nanocolumns. The crystal structure is very low in defects and efficiency of light production is good. By growing the nanocolumns at a lower temperature, the quantum well structure is better matched to the coalesced substrate and efficiency is improved.

Each QW here means one InGaN well sandwiched between two GaN barriers (in some embodiments, AlGaN wells may also be included). Growing InGaN/GaN multiple quantum wells on a coalesced GaN nanocolumn substrate at a lower temperature (around 650 degrees C.) than the typical growth temperature of conventional GaN nanocolumns (around 900 degrees C.) causes defects in the crystalline structure of the active layer of the light emitting device that lowers the efficiency of light emission.

Lowering the temperature of the growth base from around the conventional 900 degrees C. to around 810 degrees C. can cause material to form on the mask of the growth base, thus preventing the formation of the GaN nanocolumns.

Applicant has found that GaN nanocolumns exhibiting desired physical properties may be formed at a temperature in a range of 770 degrees C. to 795 degrees C., namely a temperature of about 785 C that provides for GaN structure that induces fewer defects in the quantum wells of InGaN formed thereon at a temperature of about 650 degrees C.

The Applicant has also found that a controlled level in the flux of nitrogen provided to the mask relative to amount gallium provided to the mask is required at the lower temperature of about 785 C to control the deposition of the Ga adatoms on the mask/apertures, thus preventing the formation of GaN nanostructures over the entirety of the mask and encouraging the GaN nanocolumn growth in the apertures. A controlled the flux of nitrogen as compared to conventional techniques combined with controlled lowering of the temperature of crystalline growth encourages the formation of nanocolumns that start in the apertures in the mask and that subsequently capture the Ga adatoms and the nitrogen atoms thereon, thus growing the GaN nanocolumns. This controlling of the temperature and the nitrogen flux variables may allow to grow GaN nanocolumns at the lower temperature. When In is added to the GaN to form quantum wells, the process temperature is lowered to around 650 C to avoid the instability of InGaN associated with higher process temperatures, and the InGaN/GaN quantum wells formed have fewer defects than when the GaN nanocolumns are grown at temperatures above 810 degrees C., namely in the range of 810 C to 900 C.

In the context of the present specification, unless specifically provided otherwise, the term "formation" refers to the initial phases of the process of growing of structures, for example, the GaN nanocolumns, the coalesced substrate, the quantum wells, the positively-doped (p-doped) GaN layer, the reflective layer etc. For example, it is understood that there may be a phase of the formation of the base of a nanocolumn within an aperture in a mask and raising the base of the nanocolumn slightly above the mask over the aperture. The term "growth" refers to the entire process of growing nanocolumns, including the initial phases of nanocolumn formation and the later phases of growing of the nanocolumns, to the point of their coalescence and further growth of a coalesced substrate of the GaN nanocolumns.

Reduced defects in the crystalline structure may be referred to as "defect-free", "minimal defects" or as "minimal detectable defects" in the present specification. For example, unless specifically provided otherwise, reduced defects in the crystalline structure refers to crystalline structures that have an acceptable threshold of defects, including internal and/or surface defects, making such structures more compatible for formation of subsequent layers thereon. When a crystalline structure is more compatible for formation of subsequent layers thereon, it is said that such a structure has enhanced compatibility with layers and structures grown thereon. The acceptable threshold of defects in the crystalline structure of a light emitting device provides for a suitable EQE and/or suitable light emission characteristics of a devices. Specifically, minimal defects or reduced defects of a surface of a coalesced substrate of the GaN nanocolumns is highly compatible with InGaN/GaN quantum well, which allows to form multiple quantum wells on the coalesced substrate, such that the multiple quantum wells also have reduced defects, which leads to a desired EQE and to desired light emission characteristics.

According to a first broad aspect of the present technology, there is provided a method of fabricating light emitting structure comprising an array of negatively-doped or positively-doped GaN (n-GaN or p-GaN) nanocolumns that has a coalesced substrate. The doped GaN nanocolumns are grown using molecular beam epitaxy. The coalesced substrate of the doped GaN nanocolumns has a crystal structure that can be considered to be defect-free and an enhanced compatibility with a multiple quantum well structure that may formed/grown thereon. Multiple quantum wells (hereinafter: MQWs) are formed on the coalesced substrate by molecular beam epitaxy by including at least indium (In). A layer of positively-doped (p-doped) GaN is formed on the multiple quantum wells, preferably using molecular beam epitaxy. The method may involve the following steps:

a. providing a growth substrate with a mask defining apertures for the nanocolumns;
b. heating the growth base to a first temperature of about 785° C. suitable for preventing defects between the coalesced substrate of negatively-doped or positively-doped GaN and the multiple quantum wells;
c. controlling a flux of nitrogen with respect to gallium to grow at the first temperature the doped GaN nanocolumns using molecular beam epitaxy in the apertures while preventing material from growing on the mask between the apertures until the coalesced substrate is formed;
d. heating the growth base and the coalesced substrate to a second temperature of about 650° C. or less suitable for forming the MQWs containing InGaN without creating defects;
e. controlling a flux level of the indium to form at least one InGaN layer with barrier layers of GaN therebetween to provide said MQWs on the coalesced substrate using molecular beam epitaxy;
f. heating the growth base, the coalesced substrate and the MQWs to a third temperature of about 760° C. to about 785° C.; and
g. forming a layer of positively-doped or negatively-doped GaN on the MQWs.

It is difficult to make electrical contact with positively-doped GaN (p-GaN), and, as is known in the art, a metallization layer of Ni/Au (e.g. 3 nm each) can be used to make electrical connection with p-GaN. In comparison, it is easy to make electrical contact with negatively-doped GaN (n-GaN) and no metallization layer is required.

In one aspect of the technology, the step of controlling the flux of nitrogen with respect to gallium forms the coalesced substrate. For example, the coalesced substrate that has minimal defects of its crystalline surface will enhance compatibility of its surface with the quantum wells formed thereon.

In another aspect of the technology, the first temperature is in the range of 770° C. and 795° C. As such, the first temperature is defined by the fact that it is suitable for creating such crystalline structures that provide for minimal defects or preventing defects between the coalesced substrate of negatively-doped GaN and the multiple quantum wells.

In another aspect of the technology, the step of forming the layer of positively-doped GaN includes creating Mg-doped GaN.

In another aspect of the technology, the mask is a nitridized titanium mask. It is understood that any suitable material may be used for the mask as is known in the art.

In another aspect of the technology, the mask is processed with one of a lithography and a nanoimprint technology to create the apertures. It is understood that any suitable process of creating apertures of suitable size and depth may be used as is known in the art.

In another aspect of the technology, the growth base includes a sapphire substrate. It is understood that any suitable substrate is acceptable for receiving the initial n-doped GaN growth layer thereon. Other substrates are known in the art, and they have different characteristics that may be suitable for the present technology. The growth layer of n-doped GaN may be formed on substrates of different material, and the formation may be at different temperatures, however, regardless of the temperature, the substrate material and the process of providing the substrate with the n-doped GaN growth layer, other aspects of the present technology related to n-doped GaN nanocolumn growth, MQWs, p-doped GaN layer, etc. are as described herein.

In another aspect of the technology, the growth base includes the mask that is provided on the negatively-doped GaN growth layer. As mentioned in the paragraph above, the n-doped GaN growth layer is provided on the substrate, which may be a sapphire substrate. After providing the substrate with the n-doped GaN layer, the mask is deposited on the n-doped GaN growth layer with any suitable technology known in the art.

In another aspect of the technology, the negatively-doped GaN growth layer includes Si-doped GaN. It is understood that the n-doped GaN growth layer may include other materials that provide various desired characteristics to the light emitting device.

In another aspect of the technology, the step of growing the negatively-doped GaN nanocolumns includes lateral growth caused by Ga adatoms sticking to side walls of the negatively-doped GaN nanocolumns in nitrogen rich conditions.

In another aspect of the technology, the method further comprises the step of growing at least five quantum wells. It is understood that any number of quantum wells may be grown using the present technology, and the number of five quantum wells is provided for exemplary purposes. The light emitting device may have one quantum well, two quantum wells, three quantum wells, etc. In the present specification, when referring to "multiple quantum wells" the Applicant refers to any number of quantum wells above one quantum well.

In another aspect of the technology, the method further comprises the step of controlling a height of the GaN nanocolumns relative to the size of the apertures in order to reduce defects in the coalesced substrate. The Applicant discovered that providing small apertures in the mask creates a small diameter base of a GaN nanocolumn. Such GaN nanocolumn that grows from a small base, may start its formation having one or more crystalline defects proximate the base or proximate/on the surface of the n-doped GaN growth layer. When such defect(s) are present proximate the base, these defects will be minimized, bent and terminated in the remainder of the crystalline structure of the GaN nanocolumn as it grows towards coalescence with the other GaN nanocolums. Particularly, it has been noted, that the nanocolumn height has to be sufficient to minimize that defects that propagate from the base. The smaller the aperture, the lower could be the height of the nanocolumn to minimize such defect, and consequently the larger the aperture (i.e. the larger the base), the higher the nanocolumn has to grow before coalescing with the other nanocolumns in order to minimize such defects proximate the base.

In another aspect of the technology, a smaller size of the aperture provides for lower height of the GaN nanocolumns that have the desired minimal defects.

In another aspect of the technology, the method further comprises coating the coalesced substrate, multiple quantum wells, and the layer of positively-doped GaN with an insulation layer.

In another aspect of the technology, the insulation layer is a layer of one of a SiNx and a $SiO_2$. It is understood that the material for the insulation layer may be other than a SiNx and a $SiO_2$, provided that such material exhibits desired insulation characteristics. In embodiments, there may be no insulation layer and the ambient air or environment may act as the insulation, provided, the physical characteristics of air or the environment are suitable for the operation of the light emitting device.

In another aspect of the technology, the method further comprises a step of a dry etching process to reveal the layer of positively-doped GaN, and a step of subsequently depositing a metal stack Ni, followed by an annealing process for achieving ohmic contacts. The step of dry etching to reveal the layer of the p-doped GaN may be omitted in cases when the insulation is air or the environment, as such the metal stack may be deposited on the p-doped GaN without the dry etching step. It is also understood that the dry etching process may be replaced by any other suitable process that reveals the layer of the p-doped GaN, should this layer be covered prior to being connected to ohmic contacts. It is also understood that the metal stack Ni may be replaced by any other suitable material that achieves the ohmic contact with the p-doped GaN layer.

In another aspect of the technology, further comprising controlling a concentration of indium (In) in the multiple quantum wells to control wavelengths of light emitted by the light emitting structure. For example, different quantum wells may be a different concentration of In, which may result in the light emitting device being able to emit light at different wavelengths. Each of the quantum wells may also include other materials besides indium (In) that influence the ability of the light emitting device to emit light at different wavelengths. These wavelengths may be in the visible spectrum of the human eye, the ultra-violet spectrum, the infra-red spectrum, etc.

In another aspect of the technology, the MQWs may comprises active layers of different bandgap materials to cause light to be emitted from the MQWs at a number of wavelengths together.

In another aspect of the technology, the method further comprises a step of growing $Al_xGa1-xN$ barrier layers with Al content between each GaN quantum well.

In another aspect of the technology, the method further comprises polishing a back side of the sapphire plane and adding a micro lens to the back side. It is understood that the light emitting device may emit light without polishing and adding the micro lens, however, in some applications at least polishing or at least adding a micro lens may be desirable.

According to a second broad aspect of the present technology, there is provided a method fabricating a light emitting structure comprising an array of negatively-doped GaN nanocolumns having a base and a coalesced substrate. The coalesced substrate has multiple quantum wells formed thereon. The multiple quantum wells include indium. A layer of positively-doped GaN is formed on the multiple quantum wells. The method may comprise any of the following steps:
a. providing a growth base having a sapphire plane covered with a negatively-doped or positively-doped GaN growth layer. The GaN growth layer is covered with a mask. The mask defines apertures. The apertures in the mask are designed for the formation of a base of the doped GaN nanocolumns therein;
b. heating the growth base to a first temperature in range of 770 to 795° C.;
c. providing a nitrogen source of and a gallium source to the growth base and controlling a nitrogen flux relative to gallium provided to the growth base such that a concentration of gallium relative to gallium-nitride at the mask does not initiate deposition of Ga adatoms onto the mask, rather encourages the deposition of the Ga adatoms into the apertures for growing the GaN nanocolumns therefrom by molecular beam epitaxy;
d. forming a coalesced substrate of negatively-doped or positively-doped GaN nanocolumns from the grown negatively-doped or positively-doped GaN nanocolumns, such that the coalesced substrate is composed of several negatively-doped or positively-doped GaN nanocolumns.
e. heating the growth base and the coalesced substrate to a second temperature of about 650° C. or less and providing an indium flux;
f. controlling the second temperature and the indium flux provided to the coalesced substrate to grow using molecular beam epitaxy the multiple quantum wells with indium on the coalesced substrate, while minimizes defects in the multiple quantum wells during their growth;
g. heating the growth base, the coalesced substrate and the multiple quantum wells to a temperature of about 770 to about 795° C. and growing a layer of positively-doped or negatively-doped GaN on the multiple quantum wells using molecular beam epitaxy.

In another aspect of the technology, controlling a nitrogen flux relative to gallium provided to the growth base forms a defect-free coalesced substrate. It is understood that a totally defect-free crystalline structure is highly unlikely to achieve, as such herein are included coalesced substrates that have a number of defects that is acceptable for the purposes of fabricating light emitting devices.

In the context of the present specification, unless specifically provided otherwise, the terms "nanocolumn" and "nanocolumn structure" are used interchangeably.

In the context of the present specification, unless specifically provided otherwise, the term "nanostructure" includes any structure on nanoscale, including nanocolumns, nanocolumns with coalesced substrate, coalesced substrate with MQWs, coalesced substrate with MQWs and p-doped GaN layer, nanostructure with a layer of isolation and/or a reflective layer or other layers, etc.

In the context of the present specification, unless specifically provided otherwise, the terms "negatively-doped" and "n-doped" are used interchangeably.

In the context of the present specification, unless specifically provided otherwise, the terms "positively-doped" and "p-doped" are used interchangeably.

In the context of the present specification, unless specifically provided otherwise, the terms "first temperature", "second temperature" and "third temperature" are used to show that these temperatures are used during different times of the method disclosed by the present technology. They do not imply a hierarchical or numerical relationship between the temperatures and are merely used to differentiate them from one another for the ease of understanding. It is understood that the first, the second and the third temperature may have the same measurement values in degrees C. (the same numerical value of degrees C.) taken at different times of the running the method disclosed herein.

Implementations of the present technology each have at least one of the abovementioned object and/or aspects, but do not necessarily have all of them. It should be understood that some aspects of the present technology that have resulted from attempting to attain the abovementioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

Reference will now be made in detail to some specific examples of the embodiments of the invention including some modes of carrying out the invention that are contemplated by the inventors to be suitable for understanding the technology. Examples of the specific embodiments are illustrated in the accompanying drawings. While the technology is described in conjunction with these specific embodiments, it will be understood that it is not intended to limit the invention to the described embodiments. On the contrary, it is intended to cover alternatives, modifications, and equivalents as may be included within the scope of the invention as defined by the appended claims.

In the following description, specific details are set forth in order to provide a thorough understanding of the present technology. Particular example embodiments of the present technology may be implemented without some or all of these specific details. In other instances, well known process operations have not been described in detail in order not to unnecessarily obscure the present technology.

Various techniques and mechanisms of the present technology will sometimes be described in singular form for clarity. However, it should be noted that some embodiments include multiple iterations of a technique or multiple instantiations of a mechanism unless noted otherwise.

Furthermore, the techniques and mechanisms of the present technology will sometimes describe a connection between two entities. It should be noted that a connection between two entities does not necessarily mean a direct, unimpeded connection, as a variety of other entities may reside between the two entities. Consequently, a connection does not necessarily mean a direct, unimpeded connection unless otherwise noted.

Figure 1:
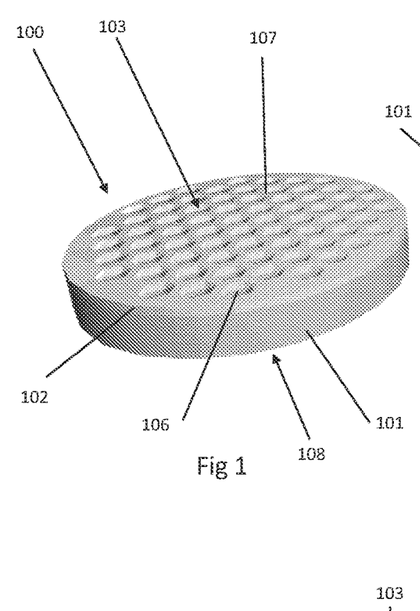
FIG. 1 is a perspective view of the growth base having a substrate, a GaN growth layer and a mask with an array of apertures defining the selective area growth in accordance with an embodiment of the present technology.
Figure 2:
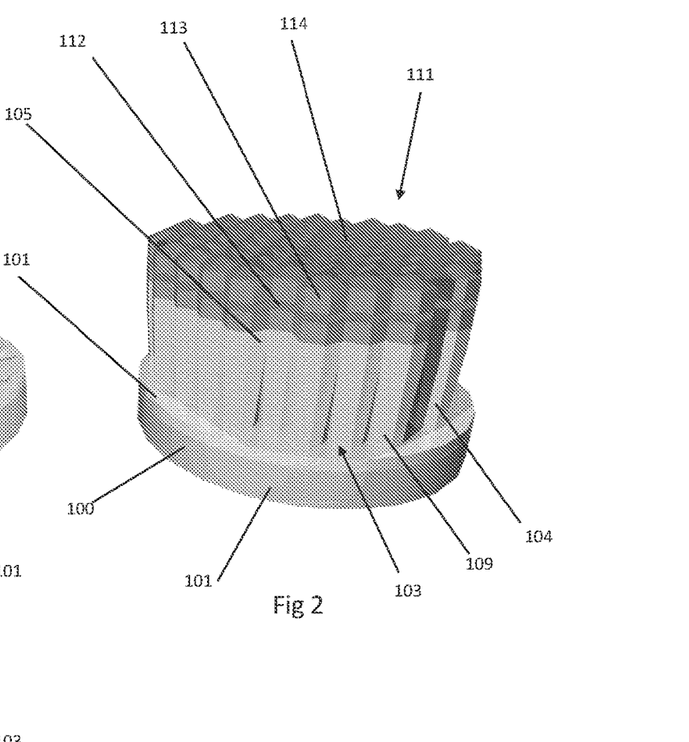
FIG. 2 is a perspective view of the growth base having of nanocolumns and a coalescent substrate thereon in accordance with an embodiment of the present technology.

FIGS. 1 and 2 illustrate schematically the nanocolumn selective area growth process in accordance with the present technology.

Particularly, FIG. 1 shows an embodiment where a growth base 100 consists of a sapphire substrate 101. The sapphire substrate 101 is covered by a n-doped GaN growth layer 106, which is covered by a mask 102 that has apertures 103 therethrough exposing the growth layer 106 through the mask 102. While in the Figures, the base and nanocolumns are n-GaN with p-GaN provided on top of the MQWs, it will be appreciated that p-GaN can be used for the base and nanocolumns with n-GaN provided on top of the MQWs.

In this exemplary embodiment, the sapphire substrate 101 is polished flat to an RMS of 1-2 nanometres (hereinafter: nm) on the side 107 that is used for forming the n-doped GaN growth layer 106 thereon, and the opposite side 108 of the substrate 101 may be coated with 2 microns of molybdenum or another high heat conductive material. In embodiments when a material alternative to sapphire is used for the growth base 100 substrate 101, such a substrate 101 would typically be also polished or otherwise processed/treated to create a sufficiently smooth surface for forming a n-doped GaN growth layer 106 thereon on one side 107 and may be coated with a heat resistant conductive material on the side 108. The molybdenum or another high heat conductive material may be deposited onto the side 108 of the sapphire substrate 101 by any suitable technological process, for example, sputtering or evaporation. Alternative materials to sapphire may include Si, GaN.

The n-doped GaN growth layer 106 may be a thin layer of about 2 microns, however, it is understood by a person skilled in the art, that the n-doped GaN growth layer 106 may have a thickness of about 2 to 5 microns. Typically, the thickness of the growth layer 106 is determined by the specific characteristics of the production facility used to fabricate the light emitting devices and the desired characteristics of the manufacturer. The n-doped GaN growth layer 106 may be grown on the sapphire substrate 101 using any suitable process known in the art, for example, by molecular beam epitaxy, MOCVD or other epitaxy process.

The side 107 of the sapphire substrate 101 that is coated with the n-doped GaN growth layer 106 is may also be coated with about 10 nm of titanium and then processed with lithography to create apertures 103, thus creating the mask 102.

As shown in FIG. 2, the apertures 103 are defined to create selected areas for the formation of the base 109 of the nanocolumns 104 of the coalesced substrate 105. The array of nanoscale apertures 103 may be performed by top-down fabrication process on the Ti mask 102.

FIG. 2 shows the nanostructure 111 grown on the growth base 100. The nanostructure 111 is an example of a type of nanostructure that may be grown using by molecular beam epitaxy by the selective area growth technique. The nanocolumns 104 are shown to extend from the growth base 100 from the apertures 103. The nanocolumns 104 coalesce at a specific height forming the coalesced substrate 105. The coalesced substrate 105 is shown to have other layers grown thereon, these layers may be a layer 112 of one or more quantum wells and a layer of p-doped GaN 113.

It is understood that the nanostructure 111 may have less or more nanocolumns 104, the nanocolumns 104 may be of any suitable height, the coalesced substrate 105 may be of any suitable height, the quantum wells layer 112 may thicker should it include a large number of quantum wells, and the p-doped GaN layer 113 may be of any suitable thickness.

FIG. 2 also illustrates that the top surface 114 of the structure 111 consists of well-ordered semipolar planes. The shape of the surface 114 is dictated by the crystalline shape of the coalesced substrate 105 of the n-doped GaN NCs 104, as the coalesced substrate 105 has a surface consisting of the same well-ordered semipolar planes (not shown on FIG. 1B).

FIGS. 1 and 2 show that the selected growth areas are placed at a distance relative to each other, whereby the distance is small enough, such that when the n-doped GaN nanocolumns 104 grow both in height and laterally, they coalesce at a certain height, thus forming a common canopy, which is the coalesced substrate 105.

Figure 3:
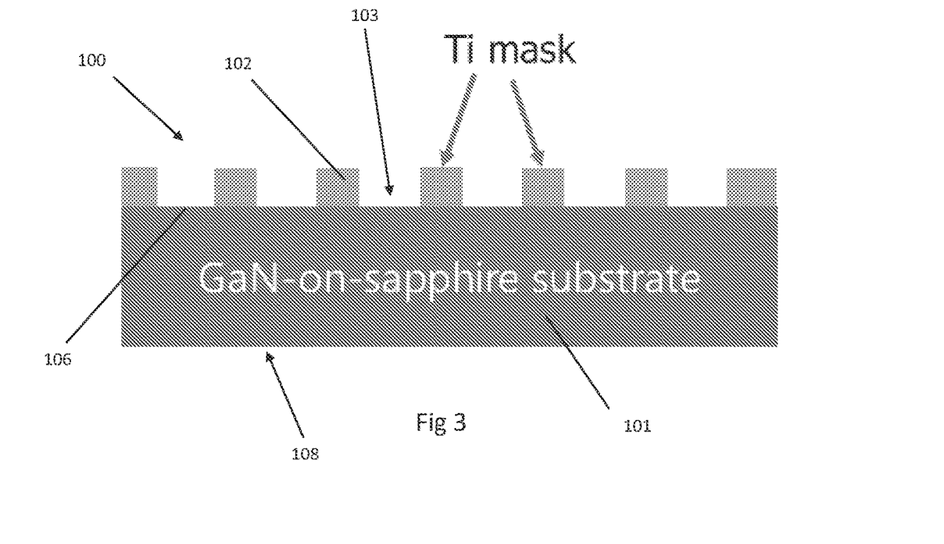
FIG. 3 is a schematic view of a cross-sectional portion of the growth base a substrate, a GaN growth layer and a mask with the array of apertures in accordance with an embodiment of the present technology.

FIG. 3 shows a portion of the growth base 100 particularly a portion of a cross-section of the growth base 100. The portion of the cross-section of the growth base 100 has a sapphire substrate 101, a n-doped GaN growth layer 106 and the mask 102 with the array of apertures 103. It may be seen that apertures 103 protrude through the mask 102 exposing the n-doped GaN growth layer 106. The n-doped GaN growth layer 106 covers the entirety of the sapphire substage 101 surface, which is the opposite surface to the bottom surface 108.

The apertures 103 are nanoscale apertures. In cases when the mask 102 is a titanium mask, the apertures 103 may be created using standard electron beam lithography process or nanoimprint technology, followed by a dry etch process. It is important to create apertures that expose the n-doped GaN growth layer 106 from under the titanium mask 102 while preventing damaging the n-doped GaN growth layer 106 exposing the sapphire substrate 101.

The n-doped GaN growth layer 106 is required for forming the base 109 of the nanocolumns 104.

To initiate the forming by molecular beam epitaxy of the base 109 of the n-doped GaN nanocolumns 104 and the growth by molecular beam epitaxy of the n-doped GaN nanocolumns 104, the growth base 100 must be heated to a first temperature in the range of 760 to 795 degrees C. and a source of nitrogen and gallium must be supplied.

In the prior art, Sekiguchi and Kishino's group are pioneers in growing GaN NCs using SAG techniques on Ti mask. In their studies, the growth temperatures (Tg) are always above 900° C. Under 900° C., no SAG occurred. [1-10] At the low Tg of 880° C., the desorption and diffusion of Ga were sufficiently suppressed; thus, crystal nucleation occurred on the space between the nanoholes. The lowest Tg ever reported by this group is 880° C. However, it was measured using a pyrometer with lack of accuracy. [5]

Also in the prior art, Kristine Bertness, Norman Sanford, and John Schlager from National Institute of Standards and Technology (NIST) reported SAG GaN NCs grown on Si template under the Tg of 835° C.-844° C. However, the NCs crystal quality is low with numbers of pores and defects in the structure. [11] Additionally, in the prior art, E. Calleja and his colleagues initially grew SAG GaN NCs at very high Tg of 900° C.-960° C. [12, 13] Later on, by improving the growth techniques, the lowest Tg achieved by this group is 840° C.-880° C.[14-22]. Furthermore, in the prior art, Zetian Mi's group has also demonstrated the low-defect GaN NCs using SAG technique. The Tg is in rage of 850° C.-1030° C.[23-27]. Also, in the prior art, Yong Ho Ra et al. from Korea Institute of Ceramic Engineering & Technology has reported SAG GaN NCs successfully grown at Tg as high as 920° C.-1010° C. Finally, in the prior art, Songui Zhao from McGill University is able to grow SAG GaN NCs with reasonable morphology and crystal quality at 865° C. [28]

The Applicants discovered that using a substantively different range first temperatures as mentioned above is required for producing a nanostructure 111 having minimal crystalline defects.

Figure 4:
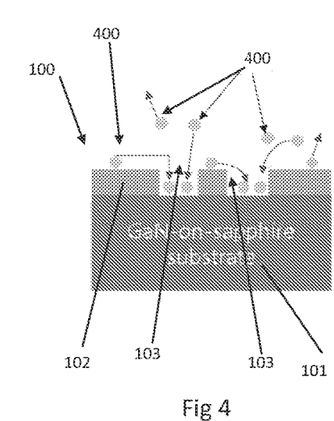
FIG. 4 is a schematic illustration of the process of Ga adatoms reaching the mask and diffusing on the mask in accordance with an embodiment of the present technology.

After the growth base 100 is heated to the first temperature in the range of 760 to 795 degrees C., the MBE process is initiated and the nitrogen flux is supplied and is controlled relative to the gallium supplied to the growth base 100, the Ga adatoms 400 will reach the mask 102 and will diffuse thereon, as shown in FIG. 4. Due to the first temperature and the control of nitrogen flux relative to gallium conditions, the Ga adatoms 400 will dwell mostly in the apertures 103 and react with N to form GaN that will bond to the GaN substrate, thus starting to form the base 109 of the n-doped GaN nanocolumns. In this way, GaN does not get deposited onto the mask 102. If the N flux is too great, the Ga adatoms may begin to react while they are briefly on the mask surface, and selective area growth or SAG can be disrupted.

Figure 5:
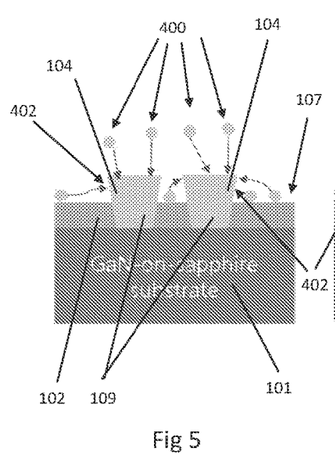
FIG. 5 is a schematic illustration of the process of the Ga adatoms reaching the apertures in the mask and starting to form the bases of the nanocolumns in accordance with an embodiment of the present technology.

Then while maintaining the first temperature in the required the range of 760 to 795 degrees C. and continuing the MBE process of growing the nanostructure 111, as shown in FIG. 5, Ga adatoms 400, which include impinging and diffused atoms, will react with N (and some Si) to form the base 109 that will extend above the mask 102 top surface 107. The base 109 of the n-doped GaN nanocolumns 104 will have minimal defects if the first temperature and the control of nitrogen flux conditions are maintained. If the N flux is high enough, the Ga adatoms may begin to react to form GaN while they are still on the side of the nanocolumns and migrating to the top surface, and widening of the nanocolumn ensues.

FIG. 5 shows that as the MBE growth process progresses, the Ga adatoms 400, which include impinging and diffused atoms, migrate onto the sidewalls 402 of the n-doped GaN nanocolumns 104, thus enhancing the lateral growth of the n-doped GaN nanocolumns 104, while other Ga adatoms 400, which include impinging and diffused atoms will contribute to the vertical growth of the n-doped GaN nanocolumns 104. Maintaining the first temperature and the control of nitrogen flux conditions keeps preventing the Ga adatoms 400 from reacting with N while onto the top surface 107 of the mask 102, while growing the nanocolumns 104 having minimal crystalline defects.

Figure 6:
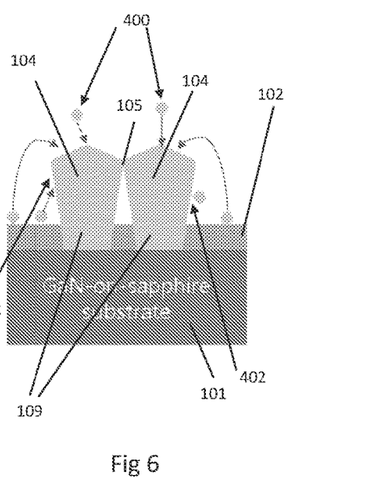
FIG. 6 is a schematic illustration of some of Ga adatoms migrating to the sidewalls of nanocolumns for lateral growth and other Ga adatoms migrating to tops of the nanocolums for vertical growth.

FIG. 6 shows that during the MBE process, the n-doped GaN NCs 104 will eventually coalesce under controlled size, diameter and orientation forming the coalesced substrate 105 of the nanostructure 111. The first temperature and the control of nitrogen flux conditions must maintained at least to the moment of the NCs 104 coalescence. The resulting coalesced substrate to eliminate defects at the boundary of the coalesced substrate 105.

In an exemplary embodiment of the MBE process in accordance with the present technology, the lateral growth of the n-doped GaN NCs 104 was is caused by Ga adatoms starting to react with N and stick to the side walls of the nanocolumns in a nitrogen rich conditions with the growth base 100 heated to 785 degrees C.

In another exemplary embodiment, high quality SAG n-doped GaN NCs 104 are grown at first temperature of 780° C. to 790° C. The growth conditions of the SAG n-doped GaN NCs 104 may consist of Ga flux of 17 nm/min (about $1.1 \times 10^{15}$ atoms/cm$^2$/s), N flux of 5 nm/min (~$3.7 \times 10^{14}$ atoms/cm$^2$/s), first temperature of 790° C.

The (S)TEM studies show that GaN NCs grown by MBE exhibit nearly defect-free structure. Structural defects including strain, threading dislocation and boundary defects due to lattice mismatch are bended and terminated towards the n-doped GaN nanocolumn's 104 sidewalls 402.

When the N flux relative to the Ga flux in the MBE process of forming n-GaN nanocolumns is too low, there is failure of GaN formation and the nanocolumns do not form. When the N flux relative to the Ga flux in the MBE process of forming nanocolumns is too great, GaN forms too quickly and selective growth in the apertures is lost because GaN forms on the mask as well. The rate of GaN formation is also slower at a temperature of 790° C. instead of 900° C., so the relative flux of N to Ga needs to be increased at the lower temperature of growing the NCs.

Referring now to FIGS. 4, 5, and 6 the rate of epitaxial growth of the n-doped GaN NCs 104 in both directions may be controlled such that all the n-doped GaN NCs 104 grown simultaneously on the growth base 100 as group meet at the top of the n-doped GaN NCs 104, i.e. coalesce, forming a continuous horizontal film of n-doped GaN with extremely high purity, i.e. the coalesced substrate 105. The coalesced substrate 105 of the n-doped GaN NCs 104 is disassociated from the lattice mismatch problems encountered in all other epitaxial growth approaches known in the art, which leads to forming a defect-free or quasi defect-free base for the MQWs to be formed on.

In one embodiment, each of the grown n-doped GaN nanocolumns 104 has a largest diameter or width of about 200 nm. These n-doped GaN nanocolumns 104 are grown from apertures 103 that are spaced apart at a distance of about 50 nm. It is understood by a person skilled in that art that other dimensions are within the scope of the present technology, for example, the distance between the apertures 103 may be anywhere in the range of 50 nm to 100 nm, the largest diameter of each n-doped GaN nanocolumn may be in the range of 200 nm to 400 nm and the height of the n-doped GaN nanocolumns may be in the range of 300 nm to 600 nm.

In another embodiment, each of the grown n-doped GaN nanocolumns 104 has been grown to 500 nm in height and had a smaller diameter than 200 nm. It is understood by a person skilled in the art that the dimensions of the epitaxially grown n-doped GaN NCs 104 depend on the exact growth conditions.

Growth conditions that have proven to be effective for giving the desired results to the Applicants are shown in the Table 1 below. The Table 1 shows the exemplary epitaxial growth conditions for the UVA n-doped GaN nanocolumns 104 having high EQE UVA emission characteristics.

TABLE 1

| Stage | Length (nm) | Plasma (W) | N flow (sccm) | CAR (° C.) | Al flux (Torr) | Ga flux (Torr) | Mg (° C.) | Si (° C.) |
|---|---|---|---|---|---|---|---|---|
| n-GaN | 500 | 350 | 0.33 | 920 | | 4E-7 | | 1180 |
| $Al_{0.09}Ga_{0.91}N$ - (×5) | 3-4 | 350 | 0.33 | 940 | 1.1E-8 | 4E-7 | | |
| GaN - (×5) | 2-3 | 350 | 0.33 | 940 | | 4E-7 | | |
| p-GaN | 50 | 350 | 0.33 | 960 | | 2.5E-7 | 340 | |

The table 1 also shows the variable additional materials that may be included into the nanostructure grown by MBE depending on the desired characteristics of a light emitting device fabricated using the technology taught in the present specification. For example, the nanostructures may consist of Si-doped and Mg-doped GaN segments, which may serve as n- and p-contact layers, respectively.

Figure 7:
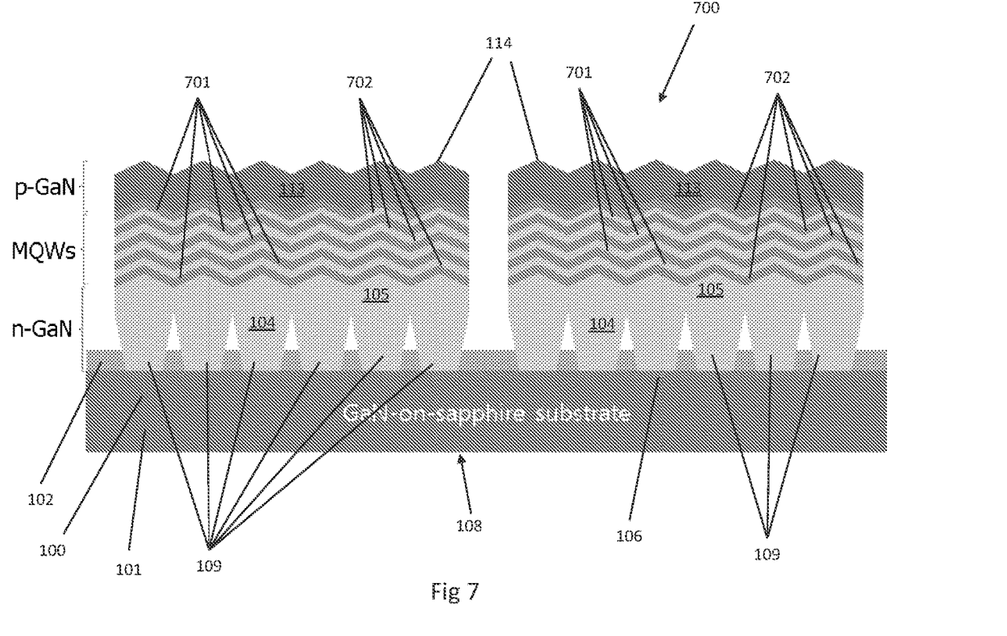
FIG. 7 is a schematic illustration of two nanostructures selectively grown on a growth base, the nanostructures including n-doped GaN, MQWs active region and p-doped GaN in accordance with an embodiment of the present technology.

FIG. 7 shows a nanostructure 700 consisting of the growth base 100 that has the n-doped GaN nanocolumns 104 grown thereon. The growth base 100 has a GaN-on-sapphire substrate 101 that has the n-doped GaN growth layer 106 exposed through the mask 102. The base 109 of the n-doped GaN nanocolumns 104 is formed on the n-doped GaN growth layer 106 of the GaN-on-sapphire substrate 101. The n-doped GaN nanocolumns 104 coalesce to form the coalesced substrate 105. Multiple quantum wells 701 are grown on the coalesced substrate 105 of the n-doped GaN nanocolumns 104. The MQWs 701 are sandwiched between the coalesced substrate 105 of the n-doped GaN nanocolumns 104 and the p-doped GaN layer 113. The p-doped GaN layer 113 has a top surface 114. The top surface 114 is adapted to having other layers formed thereon as described in more detail below.

FIG. 7 also shows barrier layers 702 that may be sandwiched between each quantum well 701. For example, the barrier layers 702 may include GaN (undoped), AlxGa1-xN layers with Al content xAl of ~9-15%, or other forms of GaN.

In accordance with the present technology, the MQW 701, the barrier layers 702 and the p-doped GaN layer 113 are grown by molecular beam epitaxy.

At least one of the MQWs 701 have In added to the GaN. The level of In affects the wavelength of the light emitted. Al can also be added, in particular to emit shorter wavelengths. When the level of Al is increased, as mentioned above, the AlGaN can form a barrier instead of an active layer.

The MBE growth process of the active and barrier layers can be repeated a number of times, preferably between three to eight times, to form the MQW region on top of the coalesced substrate 105. The layer of p-doped GaN may have thickness of 50 nm and may be grown by doping it with magnesium as per Table 1 above. AlGaN QWs will emit UV wavelength, the exact wavelength will depend on the concentration of Al in the AlGaN and this can be controlled through the density of the flux of each component. For visible light the QW material can be InGaN where the wavelength will depend on the ratio of In to Ga in the flux of each material.

It is understood by a person skilled in the art that the thickness of each QW 701, of the barrier layer 702 and of the p-doped GaN layer 113 may differ in accordance with required design characteristics of the fabrication process of the nanostructure 700.

It is also understood that a different number of MQWs 701 grown in the nanostructure 700 may give other suitable results and is within the scope of the present technology. For example, the nanostructure 700 may have one quantum well 701, two quantum wells 701, three quantum wells 701 and so on up to about 10 quantum wells.

It is also understood that different growth bases 100 having different templates of substrates 101 and mask 102 may give other suitable results and are within the scope of the present technology.

The fabrication process defined in this specification can fabricate light emitters of different diameters. The diameters are defined by a group of nanocolumns 104 that coalesce into one coalesced substrate 105 or into multiple coalesced substrates 105 grown together forming a grouped common canopy with layered multiple quantum wells 701 on each or most of the coalesced substrates 105.

Once the MQWs are formed, a further barrier of AlGaN can be added by MBE to prevent electron leakage.

On the MQWs, p-GaN is grown. As described above, the temperature for growing the p-GaN 113 can be higher as long as the InGaN is not disrupted by the heat. While MBE is efficient to grow the p-GaN 113, MOCVD can also be used.

Figure 8:
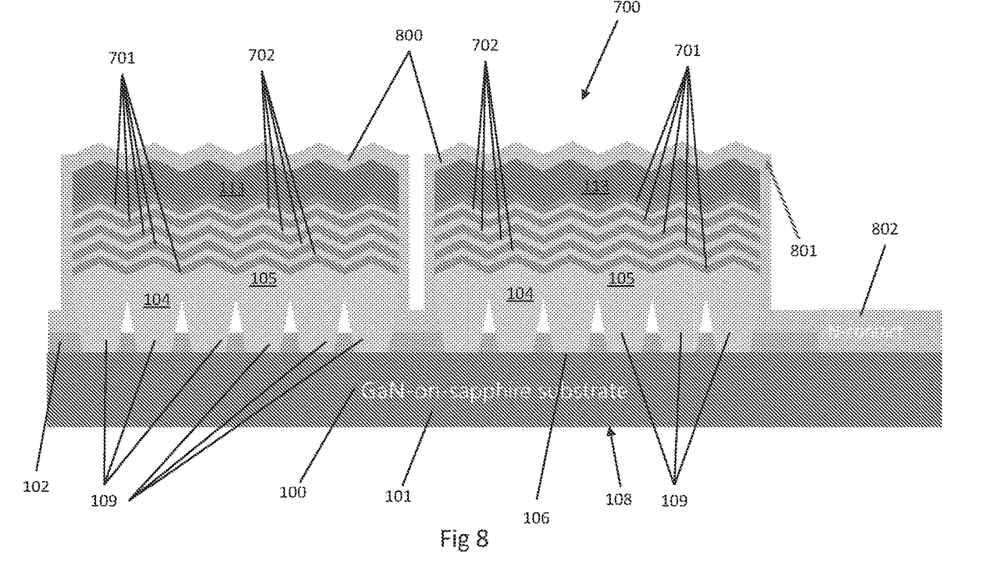
FIG. 8: is a schematic illustration of two nanostructures selectively grown on a growth base, the nanostructures including n-doped GaN, MQWs active region, p-doped GaN, a layer of insulation and an n-contact connected to the n-doped GaN in accordance with an embodiment of the present technology.

FIG. 8 shows that the nanostructure 700 may be coated with an isolation or insulation layer 800. The insulation layer 800 be include SiNx or $SiO_2$ or any other suitable material that is deposited on the n-doped GaN nanocolumns 104, the MQWs portion 701, the p-doped GaN layer 112 and the mask 102 of the nanostructure 700. In some embodiments, the deposited insulation layer 800 may be planarized to form a planar surface. The insulation layer 800 is covering every group of n-doped nanocolumns 104 forming the coalesced substrate 105 and the mask 102 between each such group. It is understood that the process of depositing the insulation layer 800 is used from any of those available in the art.

The n-contact 802 may be defined with a photolithographic step. The n-contact 802 may be defined proximate the mask 102 on the n-doped GaN growth layer 106. The arrow 801 indicates where a p-contact may be defined on the nanostructure 700.

Figure 9:
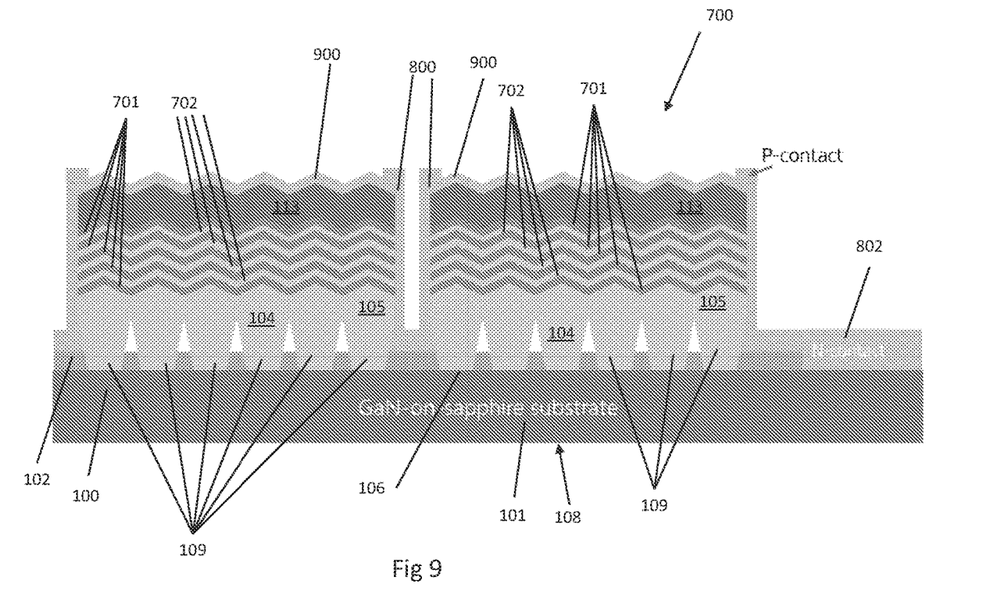
FIG. 9 is a schematic illustration of two nanostructures selectively grown on a growth base, the nanostructures including n-doped GaN, MQWs active region, p-doped GaN, a layer of insulation, an n-contact connected to the n-doped GaN and a p-contact connected to the p-doped GaN in accordance with an embodiment of the present technology.

As illustrated in FIG. 9, on each group of n-doped GaN nanocolumns 104 that are grown on the growth base 100 of the nanostructure 700 of the light emitting device, a p-contact 900 may be fabricated. In order to add the p-contact 900 to the p-doped GaN layer 113, the insulation 800 must be removed from the top surface 114 of the p-doped GaN layer 113. This may be done by etching or any other suitable approach known in the art. After exposing the top surface 114 of the p-doped GaN layer 113, the p-contact may be created by depositing about 3 nm of nickel and about 3 nm of gold, and then the nanostructure 700 can be annealed at about 450 degrees C. for about ten minutes.

The p-contact 900 described herein may have a high transparency for UVA (for example, >92%). It may also be an ohmic contact. It should be noted that in certain conditions, thicknesses of the p-contact 900 that are significantly greater than 3 nm may encourage non-linearly higher absorption for UVA. Additionally, p-contact 900 having thicknesses of significantly greater than 3 nm may compromise the efficiency and/or presence of the ohmic contact required for high efficiency conversion from electrical energy to light in the light emitting nanostructure 700.

Figure 10:
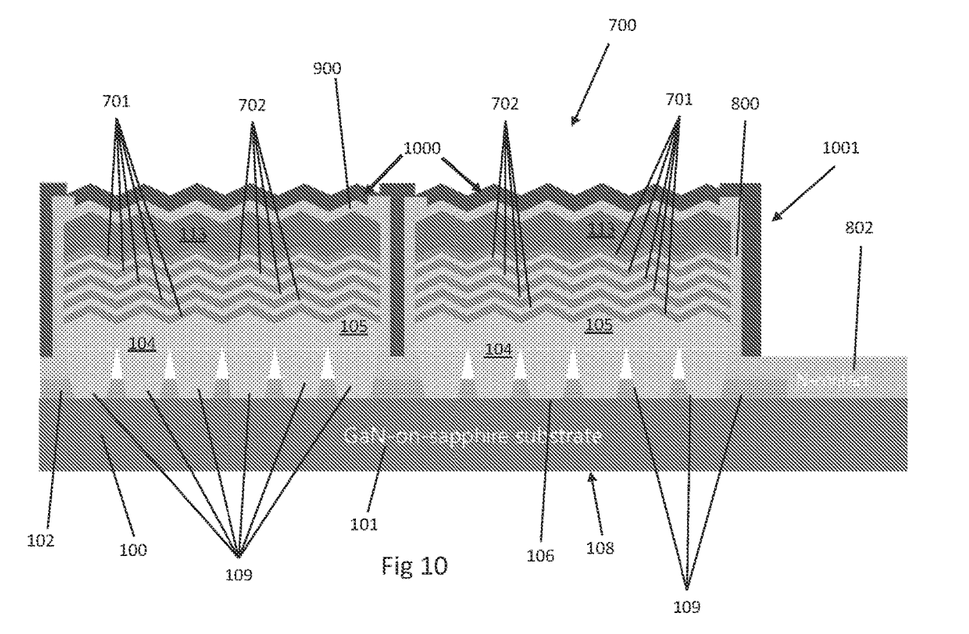
FIG. 10 is a schematic illustration of two nanostructures selectively grown on a growth base, the nanostructures including n-doped GaN, MQWs active region, p-doped GaN, a layer of insulation, an n-contact connected to the n-doped GaN, a p-contact connected to the p-doped GaN and a layer of Aluminum reflector deposited conformally in accordance with an embodiment of the present technology.

As illustrated in FIG. 7, on top of the insulation layer 800 and the p-contact layer 900, a reflective layer 1000 is deposited. The reflective layer may consist of about 50 nm thick of reflective material for 365 nm. The reflective material may be Al or any suitable reflective material known in the art. It is understood that various thicknesses of reflective material layer 1000 are contemplated within the scope of this technology and include thicknesses much greater or smaller than about 50 nm.

The reflective layer 1000 reflects the light generated within the nanostructure 700 of the light emitting device through the p-contact 900. All other light that is bounced off the reflective layer 1000 may also find its way to the bottom of the light emitting device, i.e. through the nanocolumns 104 to and through the growth base 100 the substrate 101, e.g., the sapphire substrate 101.

In some embodiments, the nanostructure 700, consisting of the growth base 100 (the GaN substrate 101 and mask 101), a of plurality of n-doped GaN nanocolumns 104 that create one or more canopies of coalesced substrates 105 with MQW 701 layered thereon, covered with p-doped GaN layer 113, a p-contact layer 900 and a reflective layer 1000, may be at least in part covered by an isolation and transparent layer on which there is a reflective layer and then another isolation layer (not shown). This last isolation layer (not shown) may serve two purposes, one may be to protect all the conductive surface from creating electrical shorts with other structure in final packaging and the other may be to provide a surface to put the n-pad 1102 (FIG. 11) and p-pad 1101 (FIG. 11), which must be at a higher level than the nanostructure 700 for the packaging purposes of a commercial light emitting device.

The light in the nanostructure 700 is emitted by the MQWs 701 in all directions. The emitted light is reflected down from the reflective layer 1000 towards the bottom surface 108 of the emitter. The light going to the side walls 1001 may be reflected off the reflective layer 1000, bouncing within the nanostructure 700 until it is reflected such that it passes through the bottom surface 108, and/or it may be absorbed internally by the nanostructure 700. All light emission may then take place through the bottom surface 108 of the substrate 101 of the growth base 100.

Figure 11:
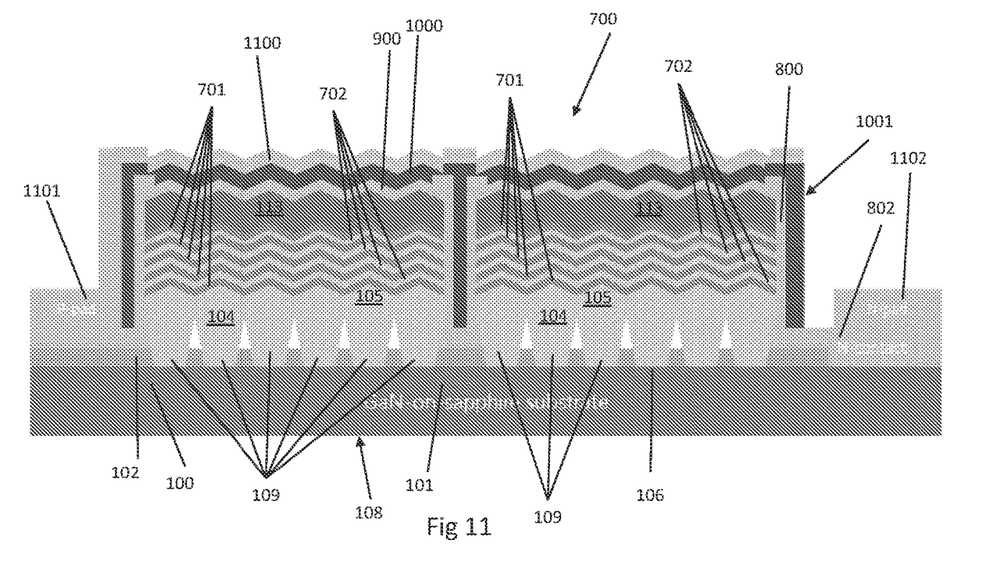
FIG. 11 is a schematic illustration of two nanostructures selectively grown on a growth base, the nanostructures including n-doped GaN, MQWs active region, p-doped GaN, a layer of insulation, an n-contact connected to the n-doped GaN, a p-contact connected to the p-doped GaN, a layer of Aluminum reflector deposited conformally, and a thick metal stack Ti/Au deposited as contact pads for bonding purpose in accordance with an embodiment of the present technology.

In embodiments that have an additional layer of insulation, for example a $SiO_2$ layer of insulation, (not shown) on top of the reflective layer 1000, the additional layer of insulation may be etched to reveal the underlying p-contact 900. A metal layer 1100 forming the traces to connect the p-contact 900 to the associated p-pad 1101 may then be deposited. FIG. 11 shows the metal layer 1100 connected to the p-pad 1101 and to the p-contact 900.

The n-contact 800 is connected to the bottom n-doped GaN growth layer 106 and it connected to the n-pad 1102, for example, by running metallic traces from a common layer between the n-contact 800 to the n-pad 1102 as shown in FIG. 11.

Driving each such p-pad 1101 while connecting the n-pad 1102 to negative, the differential being above the forward drop of the light emitting device having the nanostructure 700 may induce emission in the light emitting device.

Figure 12:
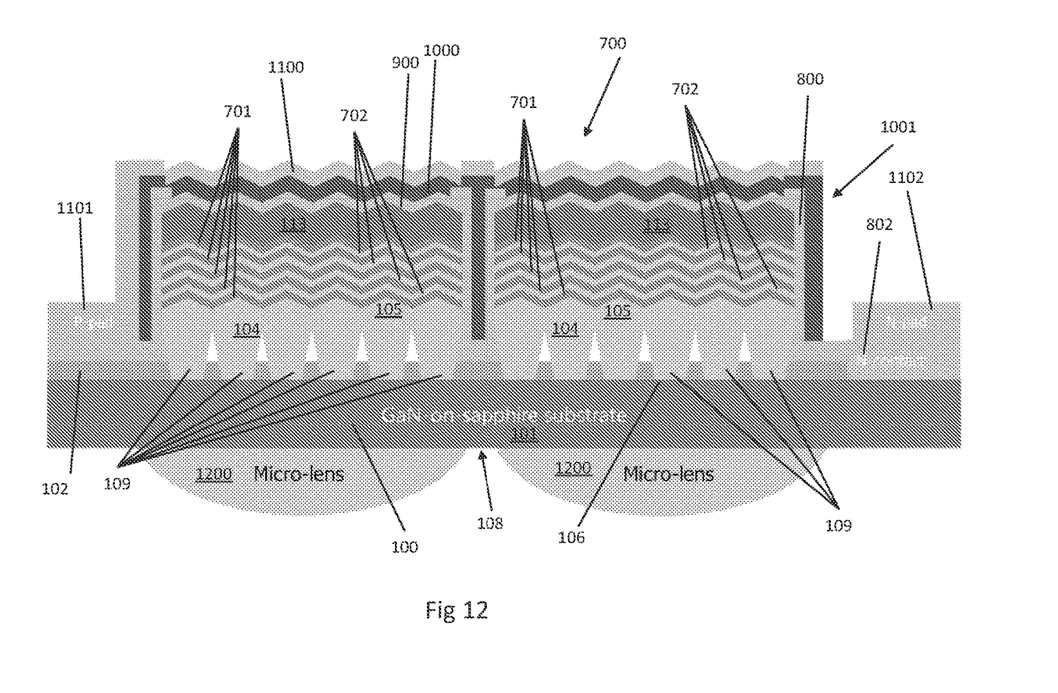
FIG. 12 is a schematic illustration of two nanostructures selectively grown on a growth base, the nanostructures including n-doped GaN, MQWs active region, p-doped GaN, a layer of insulation, an n-contact connected to the n-doped GaN, a p-contact connected to the p-doped GaN, a layer of Aluminum reflector deposited conformally, a thick metal stack Ti/Au deposited as contact pads for bonding purpose, and the growth base having micro-lenses attached thereto in accordance with an embodiment of the present technology.

FIG. 12 shows that one or more micro-lenses 1200 may be added to the bottom surface 108 of the substrate 101 of the growth base 100. The micro-lenses 1200 may enhance the light emitting characteristics of the nanostructure 700 of the light emitting device The presence of a micro-lens 1200 may further enhance the emission and to guide the light for certain applications such as imaging on photosensitive materials such as lithography. The micro-lens 1200 may be etched by plasma on the emission side of the sapphire substrate 101. It is understood that the micro-lenses 1200 may be added to the bottom surface 108 by any other technique known in the art.

Figure 13:
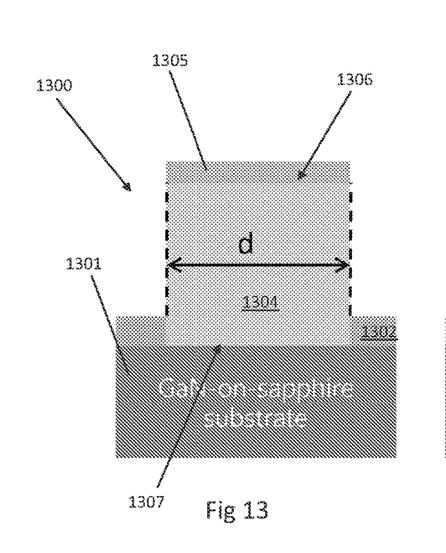
FIG. 13 is a schematic illustration of a conventional thin film fabricated light emitting device in accordance with an embodiment of the present technology.
Figure 14:
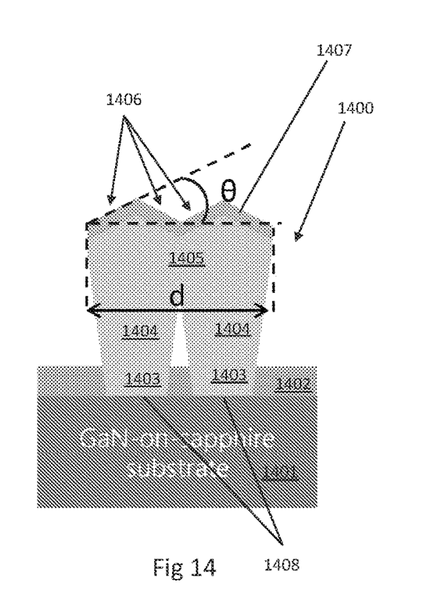
FIG. 14 is a schematic illustration of a coalesced nanocolumns fabricated light emitting device in accordance with an embodiment of the present technology.

FIGS. 13 and 14 provide an illustration of types of nanostructures that may be grown using known techniques (FIG. 13) and the process outlined herein (FIG. 14).

FIG. 13 shows a nanostructure 1300 that has a surface 1306 of a nanostructure 1304 on which a QW 1305 is formed. The nanostructure 1304 has a diameter d that is equal to the diameter of the aperture 1307 of the mask 1302. The nanostructure 1304 is grown on a substrate 1301.

FIG. 14 shows a nanostructure 1400 that has a surface 1406 of a coalesced substrate 1405 on which the QW 1407 are formed. The coalesced substrate 1405 has a diameter d, however, the coalesced substrate 1405 is grown on nanocolumns 1404 that extend from the base 1404 from the apertures 1408 that have a much smaller diameter each.

For the same diameter d of the structures 1300 and 1400, the surface 1406 is larger than the surface 1306. This provides for a QMs 1407 that generate more light than the QM 1305. The coalesced substrate 1405 consist of tops of nanocolumns 1403, as such the crystalline structure of each nanocolumn 1403 is able to correct many defects during vertical growth that may exist at the substrate 1401 and the base 1403 junction of each nanocolumn 1404. The nanostructure 1304 often lacks the ability to correct many similar defects.

The structure obtained from the above method displays higher EQE compared to present thin film methods, or high luminosity per area, at the same or lower cost (due to fewer fabrication steps) is known from the following significant achievements of the method described above:

1. The GaN nanocolumns on which the QW are constructed are of very low lattice discontinuities, resulting in higher EQE. This results from growing the GaN columns on top of a thin film GaN layer on the sapphire substrate.
2. Due to the absence of plasma ion etching in thin film emitters, because of which the EQE lessens as the emitter size reduces, nanocolumn emitters do not show lessening of EQE as the emitter size reduces.

The top of the nanocolumns is not flat (see FIG. 10) but have a semipolar plane. This makes the top of the coalesced structure to be non-planer. This increases the area of the emitter as compared to thin film emitters. The increase in area can be computed as;

$$A_{flat} = A_{semipolar} \times \cos \theta$$

Where θ is the inclination angles of a semipolar plane in a wurtzite GaN lattice as shown in FIG. 14.

Depend on growth conditions, θ varies in range of 30°-58°, corresponding to an increase in active area of 25%-100%

Thus, the total emissions per area of the emitter will be higher than thin film devices.

Figure 15:
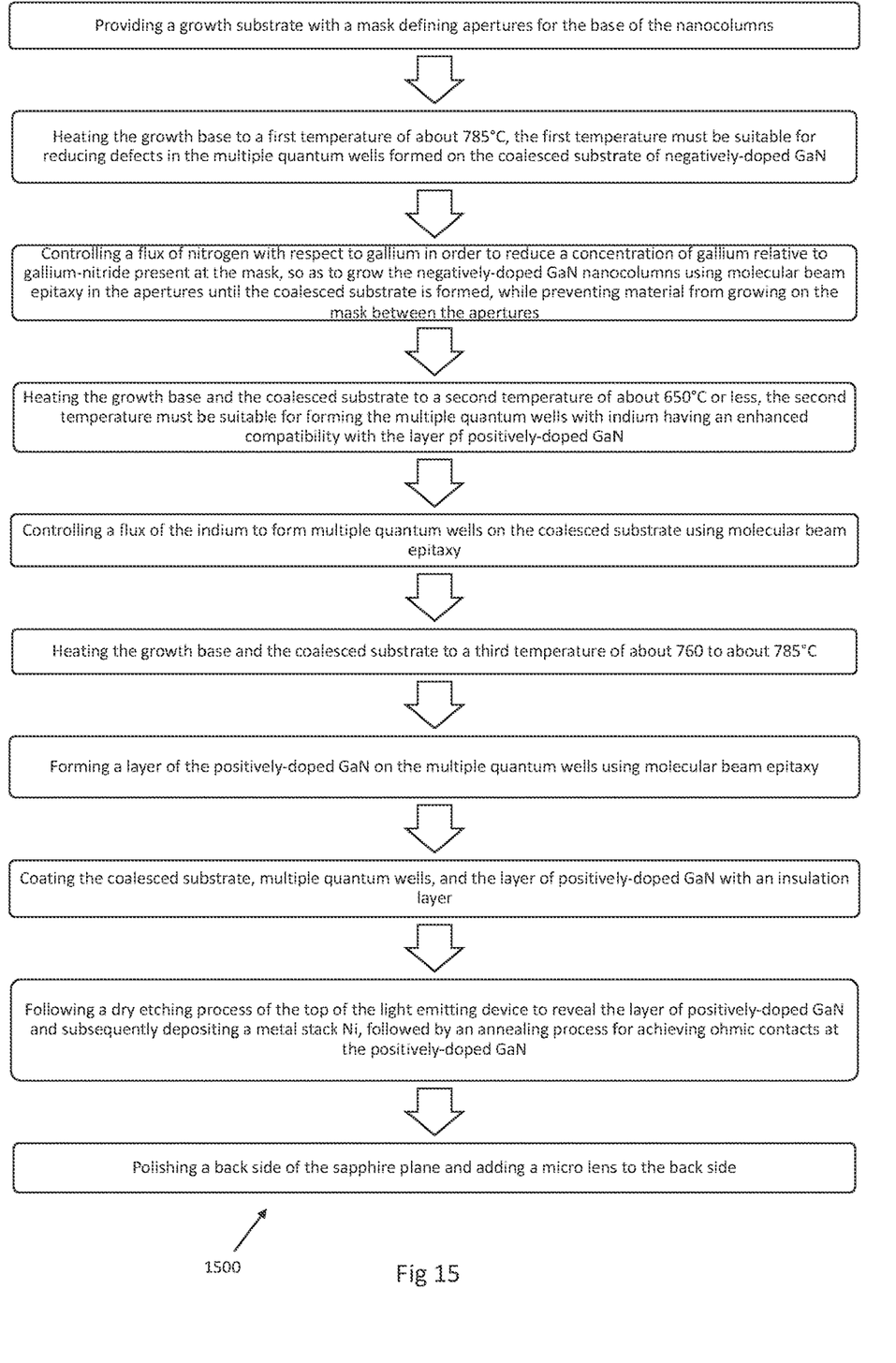
FIG. 15 is schematic representation of the steps a method of fabricating a light emitting device using coalesced nanocolumns process in accordance with an embodiment of the present technology.

FIG. 15 illustrates steps of a method 1500 of a fabrication of a light emitting device in accordance with the present technology.

In the above description, numerous specific details are set forth, but embodiments of the invention may be practiced without these specific details. Well-known circuits, structures and techniques have not been shown in detail to avoid obscuring an understanding of this description. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

Some of these steps are well known in the art and, as such, have been omitted in certain portions of this description for the sake of simplicity.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A method of fabricating light emitting structure comprising an array of negatively-doped or positively-doped GaN nanocolumns having a coalesced substrate, the nanocolumns being grown using molecular beam epitaxy at a low temperature such that the coalesced substrate has an enhanced compatibility with a multiple quantum well structure, multiple quantum wells formed on the coalesced substrate by molecular beam epitaxy by including indium (In), and a layer of positively-doped or negatively-doped GaN formed on the multiple quantum wells using molecular beam epitaxy, the method comprising:
   providing a growth substrate with a mask defining apertures for the nanocolumns;
   heating the growth substrate to a first temperature of about 785° C. suitable for reducing defects in the multiple quantum wells formed on said coalesced substrate and;
   controlling a flux of nitrogen with respect to gallium to grow in the apertures at the first temperature the negatively-doped or positively-doped GaN nanocolumns using molecular beam epitaxy while preventing material from growing on the mask between the apertures until the coalesced substrate is formed;
   heating the growth substrate and said coalesced substrate to a second temperature of about 650° C. or less suitable for forming the multiple quantum wells with at least indium having an enhanced compatibility with said coalesced substrate;
   controlling a flux of the indium to form barrier layers of GaN and at least one active layer of InGaN to provide the multiple quantum wells on the coalesced substrate using molecular beam epitaxy; and
   heating the growth substrate and said coalesced substrate to a third temperature of about 760 to about 785° C.; and
   forming an upper layer of the positively-doped or negatively-doped GaN on the multiple quantum wells (MQWs).

2. The method of claim 1, wherein the layer of the positively-doped GaN is formed using molecular beam epitaxy.

3. The method of claim 1, wherein the first temperature is in the range of 770° C. and 795° C.

4. The method of claim 1, wherein the positively-doped GaN is Mg-doped GaN.

5. The method of claim 1, wherein the mask is a nitridized titanium mask.

6. The method of claim 1, wherein the mask is processed with one of a lithography and a nanoimprint technology to create the apertures.

7. The method of claim 1, wherein the growth substrate includes a sapphire substrate.

8. The method of claim 1, wherein the growth substrate includes the mask being on a negatively-doped GaN growth layer.

9. The method of claim 8, wherein the negatively-doped GaN growth layer includes Si-doped GaN.

10. The method of claim 1, further comprising growing at least five quantum wells.

11. The method of claim 1, further comprising coating the coalesced substrate, multiple quantum wells, and said upper layer with an isolation layer.

12. The method of claim 11, wherein the isolation layer is a layer of one of a SiNx and a $SiO_2$.

13. The method of claim 1, further comprising a step of a dry etching process to reveal said upper layer, and a step of subsequently depositing Ni and Au, followed by an annealing process for achieving ohmic contacts.

14. The method of claim 1, further comprising controlling a concentration of In in the multiple quantum wells to determine wavelengths of light emitted by the light emitting structure.

15. The method of claim 1, wherein the MQWs have layers with different bandgaps for emitting light at different wavelengths.

16. The method of claim 15, wherein the different wavelengths combine to provide white light.

17. The method of claim 1, further comprising growing AlxGa1-xN barrier layers with Al content between each GaN quantum well.

18. The method of claim 1, further comprising polishing a back side of a sapphire plane of the growth substrate and adding a micro lens to the back side.

19. The method of claim 1, wherein the coalesced substrate consists of well-ordered semipolar planes.

* * * * *